United States Patent
Kim et al.

(10) Patent No.: US 10,840,241 B2
(45) Date of Patent: Nov. 17, 2020

(54) RESISTOR DIVIDER WITH IMPROVED RESISTOR MATCHING

(71) Applicant: Texas Instruments Incorporated, Dallas, TX (US)

(72) Inventors: Sunglyong Kim, Allen, TX (US); Richard Lee Valley, Nashua, NH (US); Tobin Daniel Hagan, Plano, TX (US); Michael Ryan Hanschke, Dallas, TX (US); Seetharaman Sridhar, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/240,356

(22) Filed: Jan. 4, 2019

(65) Prior Publication Data
US 2020/0219872 A1    Jul. 9, 2020

(51) Int. Cl.
| | |
|---|---|
| *H01L 27/07* | (2006.01) |
| *H01L 49/02* | (2006.01) |
| *H01L 29/78* | (2006.01) |
| *H01L 21/8238* | (2006.01) |
| *H01L 29/16* | (2006.01) |
| *H01L 27/06* | (2006.01) |
| *G01R 15/04* | (2006.01) |
| *H01L 29/51* | (2006.01) |

(52) U.S. Cl.
CPC .......... *H01L 27/0738* (2013.01); *G01R 15/04* (2013.01); *H01L 21/823871* (2013.01); *H01L 21/823892* (2013.01); *H01L 27/0629* (2013.01); *H01L 28/20* (2013.01); *H01L 29/16* (2013.01); *H01L 29/7817* (2013.01); *H01L 29/517* (2013.01)

(58) Field of Classification Search
CPC .................... H01L 27/0629; H01L 29/7817
See application file for complete search history.

(56) References Cited

U.S. PATENT DOCUMENTS

| | | | | |
|---|---|---|---|---|
| 2007/0176260 A1* | 8/2007 | Parekh | ..................... | H01L 28/20 257/536 |
| 2013/0032922 A1* | 2/2013 | Kawahara | ............. | H01L 21/761 257/492 |
| 2013/0335106 A1* | 12/2013 | Hozoi | ..................... | H01C 13/02 324/713 |
| 2013/0342187 A1* | 12/2013 | Hozoi | ..................... | G01R 15/04 324/120 |
| 2019/0109130 A1* | 4/2019 | Yoshino | .............. | H01L 23/5286 |

* cited by examiner

*Primary Examiner* — Farun Lu
(74) *Attorney, Agent, or Firm* — Rose Alyssa Keagy; Charles A. Brill; Frank D. Cimino

(57) ABSTRACT

Described examples include a semiconductor device having a resistor. The resistor includes a first terminal and a second terminal. The resistor also includes a first resistive element over an insulating layer over a substrate having a first end coupled to the first terminal of the resistor and a second end coupled to the second terminal of the resistor; and a parallel second resistive element over the insulating layer over the substrate having a first end coupled to the first terminal of the resistor and a second end coupled to the second terminal of the resistor. The resistor may also be coupled in series with another resistor.

10 Claims, 9 Drawing Sheets

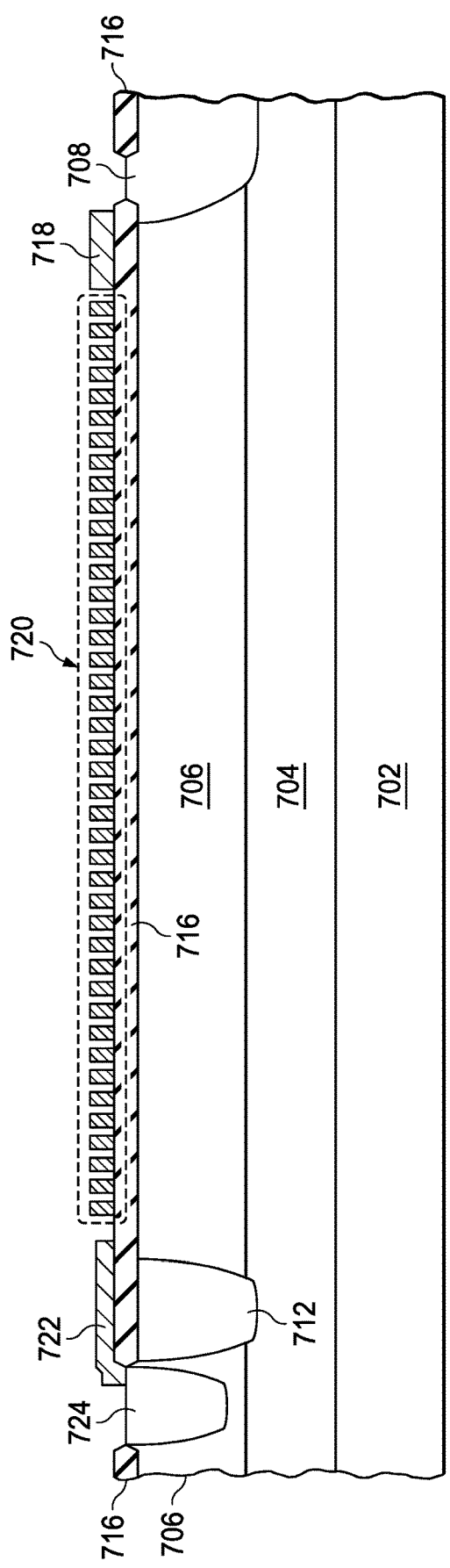
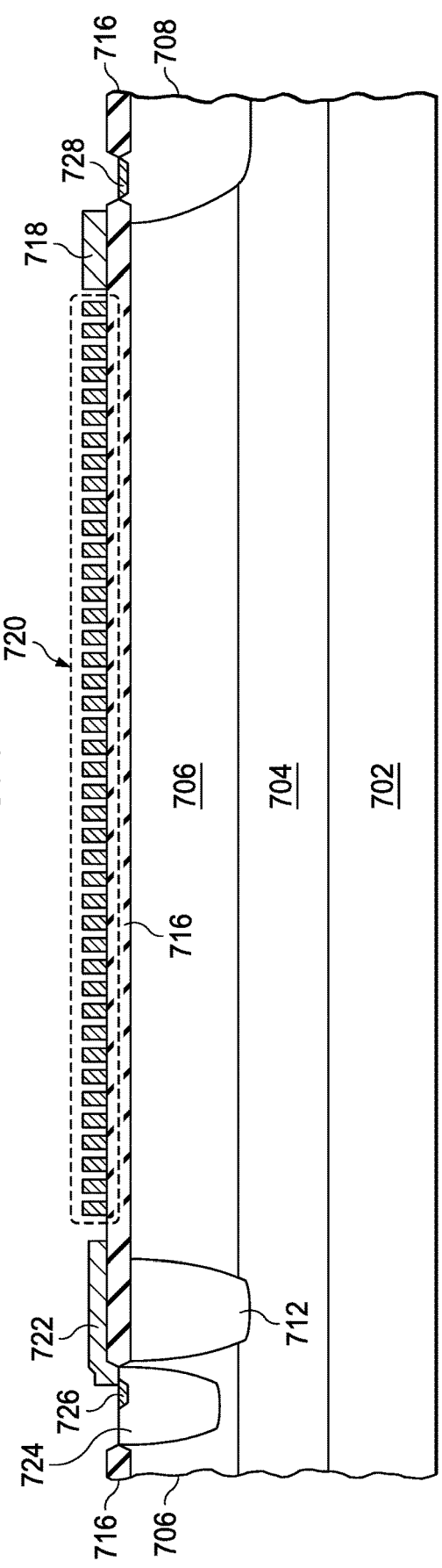

RESISTOR DIVIDER WITH IMPROVED RESISTOR MATCHING

TECHNICAL FIELD

This relates generally to resistors, and, in examples to resistors in semiconductor devices.

BACKGROUND

Voltage dividers are commonly used in electronic circuitry. In a typical voltage divider two resistors connect in series. The resistor connected between the high voltage and the node between the two resistors is the high voltage resistor. The resistor between the node and a reference potential (often ground) is the low voltage resistor. The divided voltage is at the node between the series resistors. The ratio of the resistances of the resistors determines the proportion of the voltage that occurs at the node between the two resistors. In certain applications, the ratio of the resisters must be precise to provide accurate measurement of the voltage across the series resistors. For example, in power factor correction (PFC), voltage dividers lower the voltage measured from a high voltage, for example 700 volts. Active devices that can handle such voltages are large and slow. To avoid the use of such devices, voltage dividers can divide the high voltage to a manageable voltage that smaller and faster devices can measure. For example, a ratio between high voltage resistor and the low voltage resistor can be about 100 to 1. With a large ratio, the resistance of the low voltage resistor must be accurate because deviations from the specified value for the low voltage resistor can create large inaccuracies in the voltage ratio and thus the measured voltage. With discrete resistors, the accuracy of the resistances can be very high. However, with resistors formed in semiconductor devices, producing resistors with high accuracy and high repeatability is challenging.

BRIEF DESCRIPTION OF THE DRAWINGS

FIGS. 7A-7H (collectively "FIG. 7") are schematic diagrams illustrating the steps of the example process of FIG. 6.

DETAILED DESCRIPTION

Figure 1A:
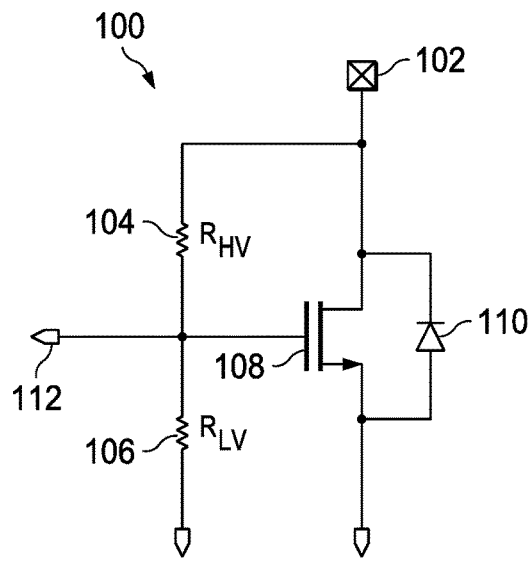
FIGS. 1A and 1B (collectively "FIG. 1) are circuit diagrams of an example voltage divider circuit.

In the drawings, corresponding numerals and symbols generally refer to corresponding parts unless otherwise indicated. The drawings are not necessarily drawn to scale.

In this description, the term "coupled" may include connections made with intervening elements, and additional elements and various connections may exist between any elements that are "coupled." Also, in this description, the terms "on" and "over" may include layers or other elements where intervening or additional elements are between an element and the element that it is "on" or "over."

Figure 1B:
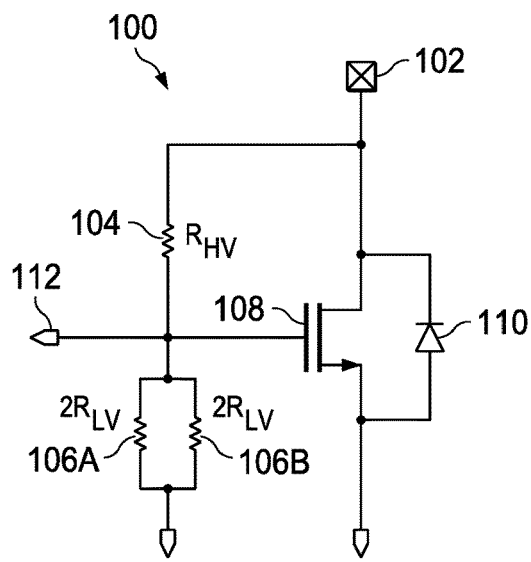

FIGS. 1A and 1B (collectively "FIG. 1") are circuit diagrams of an example voltage divider circuit 100. The measured high voltage is applied to high voltage input port 102. In FIG. 1A, high voltage resistor 104 and low voltage resistor 106 are configured as a voltage divider. High voltage resistor 104 has a resistance value of 12 MΩ, for example. Low voltage resistor has a resistance value of 120 KΩ, for example. Thus, in this example, the voltage at output terminal 112 is the voltage at high voltage input port 102 divided by 100. Thus, the voltage at output terminal 112 is the voltage at high voltage input port 102 divided by 100. High voltage input port 102 couples to the drain of laterally diffused metal-oxide-semiconductor (LDMOS) transistor 108. The gate of LDMOS transistor 108 couples to node 105.

FIG. 1B is another circuit diagram of voltage divider circuit 100. FIG. 1B shows that low voltage resistor 106 is two resistive elements 106A and 106B connected in parallel in this example. The value of resistive elements 106A and 106B is two times ($2R_{LV}$) the resistance of low voltage resistor 106 ($R_{LV}$). The use of two resistive elements rather than one provides a more stable resistor value, as further explained below.

Figure 2:
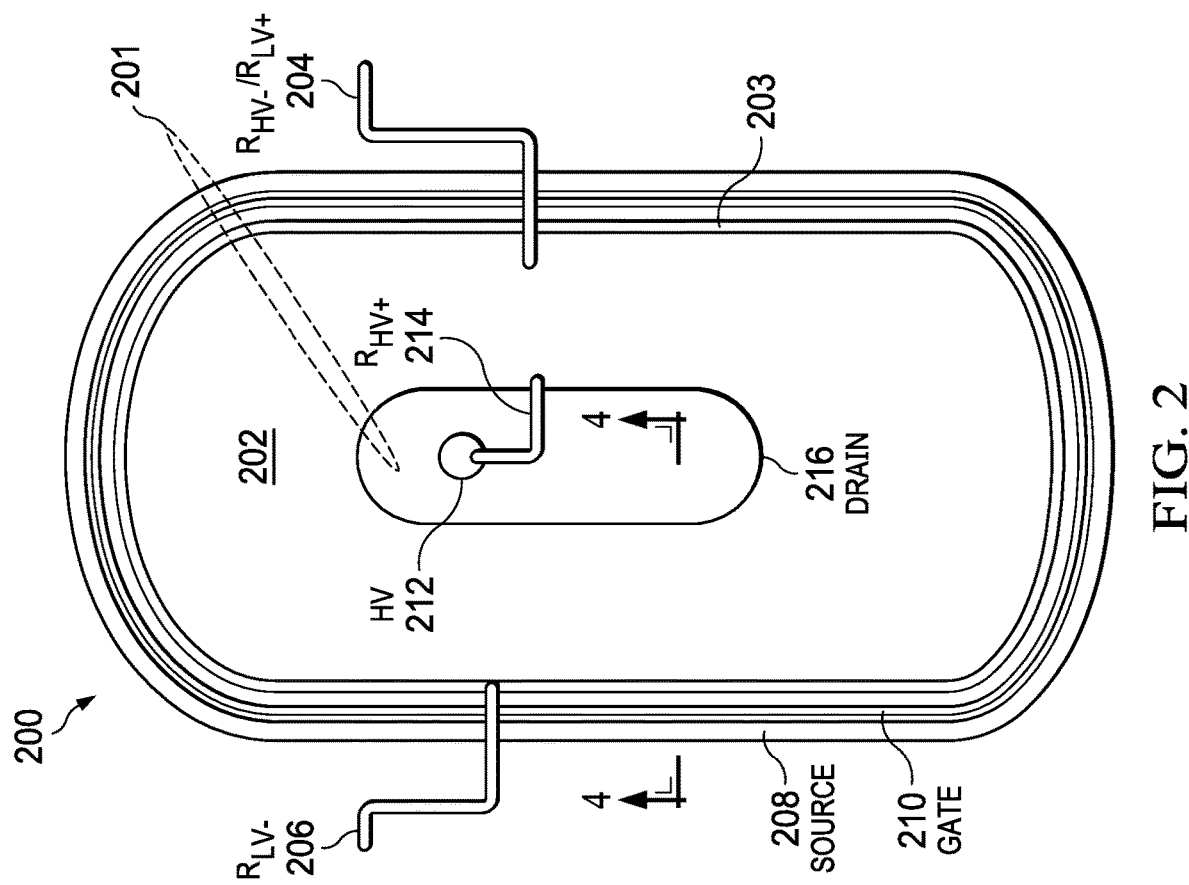
FIG. 2 is a layout diagram of an example LDMOS transistor device with a high voltage resistor and a low voltage resistor.

FIG. 2 is a layout diagram of a circuit 200 having an LDMOS transistor 201 with a high voltage resistor 202 and a low voltage resistor 203. High voltage resistor 202 and low voltage resistor 203 are formed over the lateral diffusion area of LDMOS transistor 201. Gate 210 and source 208 of LDMOS transistor 201 surround high voltage resistor 202 and low voltage resistor 203. Drain 216 and drain contact 212 couple to the measured high voltage. Although FIG. 2 shows one drain contact 212, other examples include multiple drain contacts to distribute the stress of the high voltage. Drain contact 212 also connects to a first terminal of high voltage resistor 202 at connection 214. As further explained hereinbelow, in this example, the high voltage resistor includes hundreds of loops of a polycrystalline silicon strip in a spiral that loops around the drain region of LDMOS transistor 201. Other suitable resistive materials are silicon chromium (SiCr), nickel chromium (NiCr), and tantalum nitride (TaN). The loops form a spiral of one continuous strip of resistive material to provide a resistance of 12 MΩ, for example. A second terminal of high voltage resistor 202 couples to connection 204.

The outer two loops of resistive material are not part of the loops of high voltage resistor 202. Rather, the outer two loops are part of low voltage resistor 203. In this example, low voltage resistor 203 includes two loops that encircle high voltage resistor 202. These two loops include the same resistive material as high voltage resistor 202 because, in this example, they are formed in the same manufacturing step as high voltage resistor 202, as further explained hereinbelow. High voltage resistor 202 and low voltage resistor 203 form an oval in FIG. 2. However, the configuration of high voltage resistor 202 and low voltage resistor 203 can be any number of geometric shapes. The outer two loops of low voltage resistor 203 do not couple with each other except by connection 204 and connection 206, both of which couple to both loops. Thus, the outer loops of low voltage resistor 203 form two parallel resistors where the resistance of each resistor is determined by the distance between a first terminal at connection 204 and second terminal at connection 206, and by the material composition of the outer loops and the cross-sectional size of the outer loops. In this example, each outer loop has a resistance of 24

KΩ. Because the two outer loops connected in parallel, the resistance of low voltage resistor 203 is 12 KΩ. The two outer loops correspond to resistive elements 106A and 106B (FIG. 1B).

Figure 3:
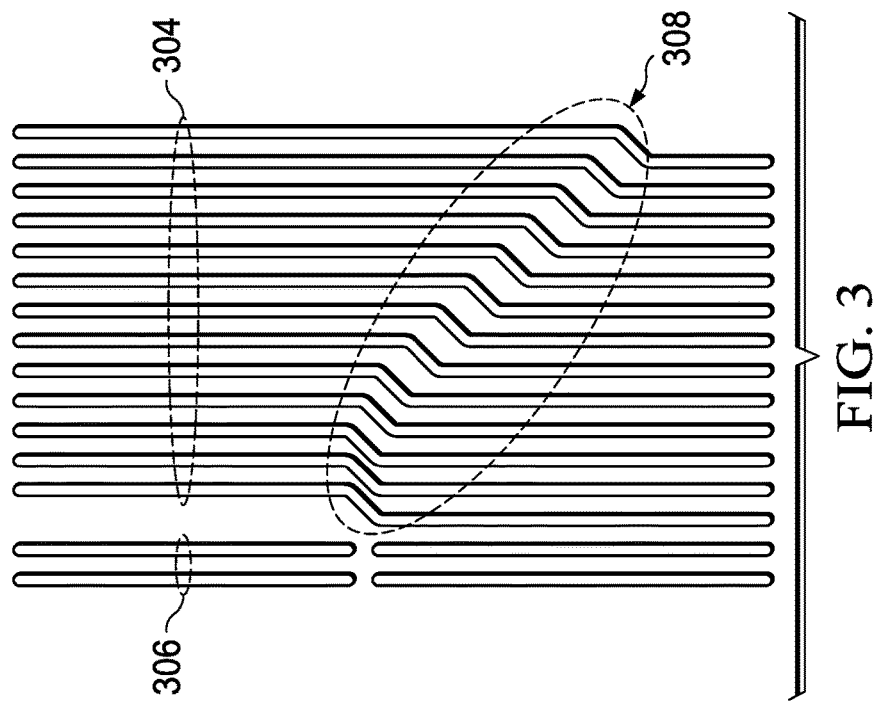
FIG. 3 is a detail diagram of the low voltage resistor and the high voltage resistor of FIG. 2.

FIG. 3 is a detail diagram of low voltage resistor 203 and high voltage resistor 202 (FIG. 2). First resistive lead 304 includes shifts 308 that allows one lead to encircle drain 216 (FIG. 2) multiple times in a spiral. FIG. 3 shows thirteen loops for simplicity but high voltage resistor 202 (FIG. 2) includes up to several hundred loops in this example. Second resistive leads 306 include two leads that encircle high voltage resistor 202 (FIG. 2). A portion of each lead serves as the respective resistive elements 106A and 106B (FIG. 1). The portion of second resistive leads 306 used is determined by the position of connection 204 and connection 206 (FIG. 2). Connection 204 and connection 206 couple to both of second resistive leads 306 at their respective contact points. This helps match the resistance values of resistive elements 106A and 106B.

Figure 4:
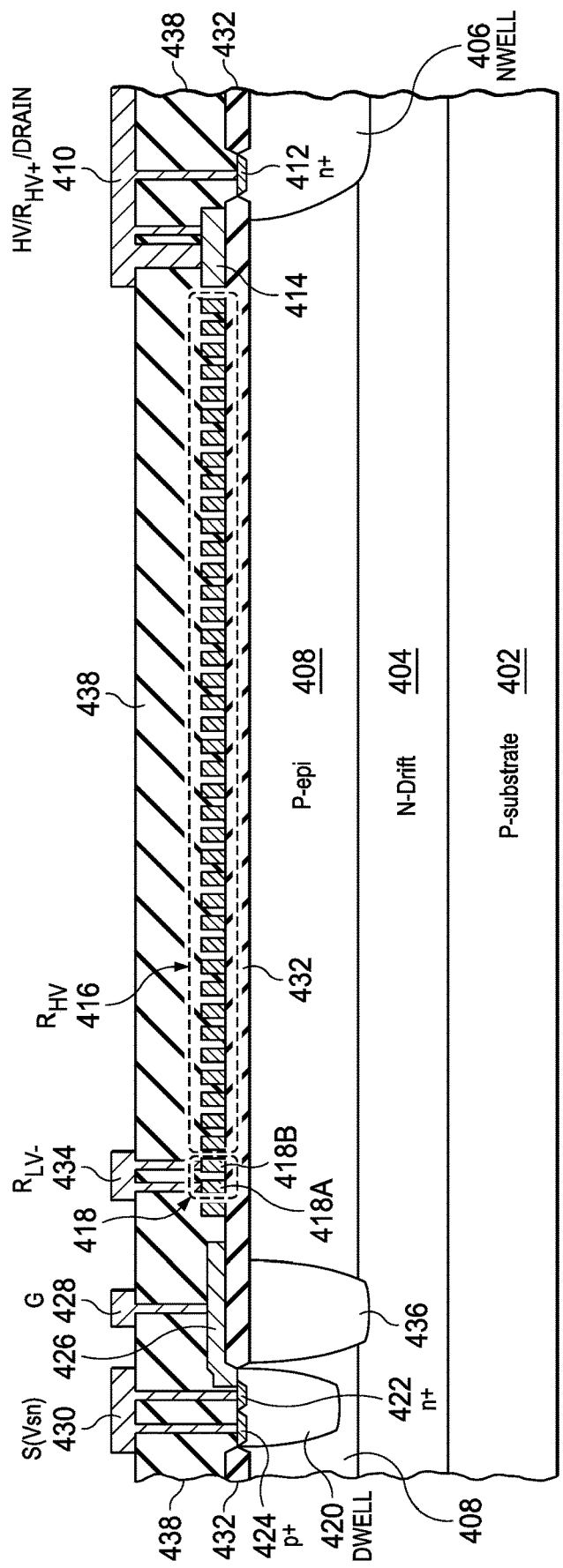
FIG. 4 is a cut-away diagram of a portion of an example device like that of FIG. 2.

FIG. 4 is a cut-away diagram of a portion of an example device like that of FIG. 2. A description hereinbelow regarding FIGS. 6 and 7 describes an example process for fabricating the device of FIG. 4. FIG. 4 extends from the drain 216 to source 208 (FIG. 2). Epitaxial layer 408 is formed by epitaxial deposition over substrate 402, which includes drift layer 404. In this example, substrate 402 is P type, epitaxial layer 408 is N type and epitaxial layer 408 is P-type. N-well 406 is in epitaxial layer 408. Drain contact 412 is in N-well 406. Double-diffused well (d-well) 420 is formed in epitaxial layer 408. Source contact 422 is in d-well 420. D-well contact 424 is in d-well 420. Channel diffusion 436 is in epitaxial layer 408 beneath gate 426. Insulating layer 432 provides the gate insulator and insulates high voltage resistor 416 and low voltage resistor 418 from the drift region of epitaxial layer 408. Low voltage resistor 418 includes first resistive element 418A and second resistive element 418B coupled in parallel. In FIG. 4, first resistive element 418A and second resistive element 418B couple at one end by resistive element contact 434. The other end of first resistive element 418A and second resistive element 418B couple by another contact such as connection 204 (FIG. 2, not shown in FIG. 4), which also couples to one end of high voltage resistor 416. As explained further herein below, connecting two or more resistive elements in parallel reduces the variability of the resistance of low voltage resistor 418.

In this example, drain contact 410 contacts drain contact 412, and high voltage resistor contact 414 through first level metal insulator layer 438. Resistive element contact 434 contacts the lower voltage end of low voltage resistor 418. Gate contact 428 contacts gate 426. Source contact 430 contacts source contact 422 and d-well contact 424. FIG. 4 shows contacts 410, 434, 428 and 430 along one position of the loop of high voltage resistor 416 and low voltage resistor 418. This is for explanatory purposes only. Practical layouts of a device like circuit 200 with LDMOS transistor 201 with high voltage resistor 202 and low voltage resistor 203 (FIG. 2) have these contacts at different positions on the loop. An additional contact (not shown) couples the low voltage end of high voltage resistor 416 to the high voltage end of low voltage resistor 418.

Figure 5:
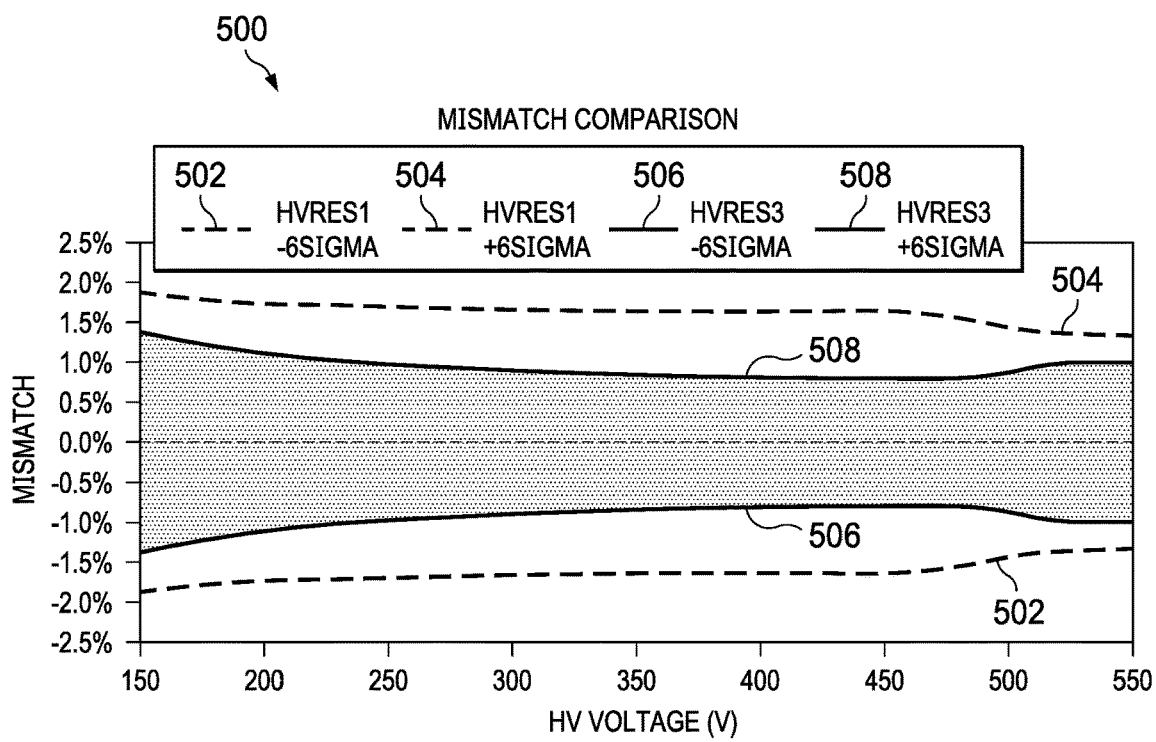
FIG. 5 is a graph showing the improved matching from using two low voltage resistive elements.

FIG. 5 is a graph 500 showing the improved matching from using two lower voltage resistive elements (e.g. resistive elements 106A and 106B of FIG. 1B) as compared to on lower voltage resistor. Thirty-five devices like voltage divider circuit 100 (FIG. 1A) were fabricated with one low voltage resistor and thirty-five devices like voltage divider circuit 100 (FIG. 1B) were fabricated with two low voltage resistors in parallel. Line 502 shows the lower six sigma deviation of the one resistor devices. Line 504 show the upper six sigma deviation of the one resistor devices. Line 506 shows the lower six sigma deviation of the two resistor devices. Line 508 shows the upper six sigma deviation of the two resistor devices. As shown in graph 500, for most voltage levels, the deviation of the two transistor devices is 50 to 70% smaller than the one transistor devices. This is because some second order effects such as contact resistance and a critical dimension (width) of polycrystalline silicon resistor (CD) tend to vary between resistance loops, and thus tend to offset. Thus, using two or more loops for the lower voltage resistor increases the accuracy of the resistance.

Figure 6:
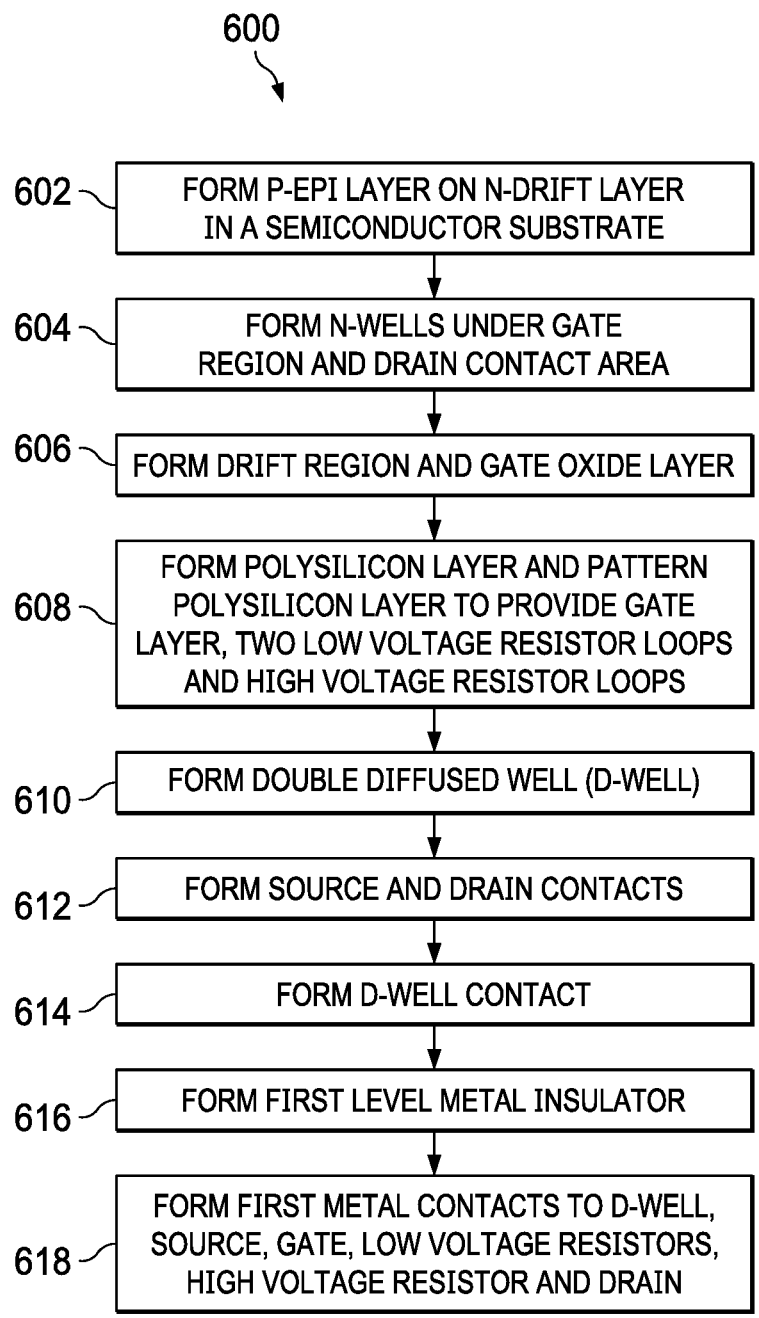
FIG. 6 is a flow diagram of an example process.
Figure 7A:
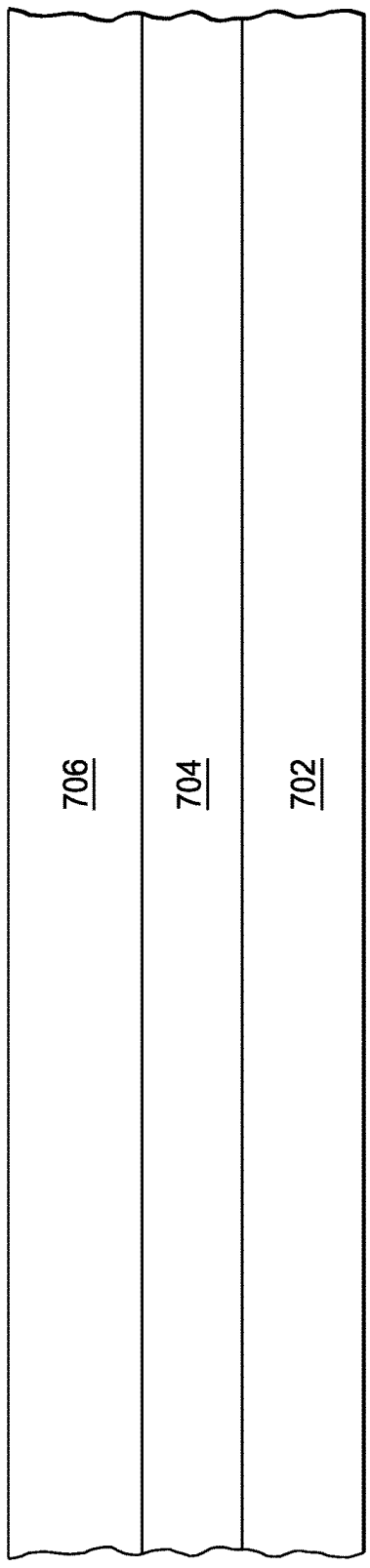
Figure 7B:
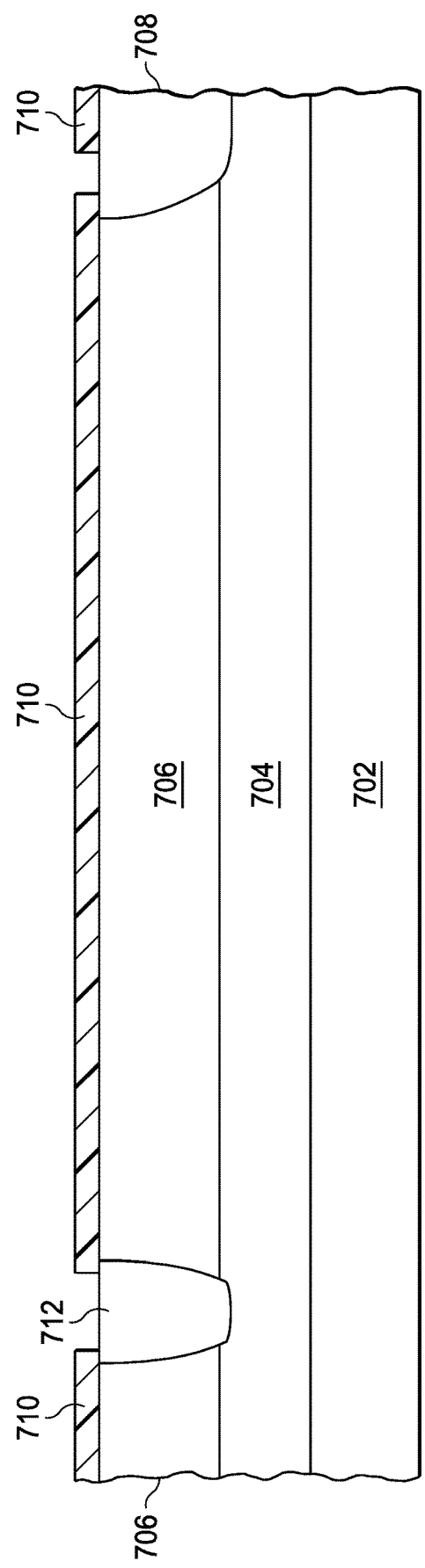

FIG. 6 is a flow diagram of an example process 600. FIGS. 7A-7H (collectively "FIG. 7") illustrate the steps of process 600. Step 602 is forming a p-type epitaxial layer 706 on an n-type drift layer 704 in a semiconductor substrate 702 as shown in FIG. 7A. Ion implantation of n-type dopants at $6 \times 10^{11}$ to $6 \times 10^{12}$ atoms/cm$^2$ forms drift layer 704 to a thickness of 1 to 3μ after annealing. Epitaxial deposition forms epitaxial layer 706 to a thickness of 3 to 10μ. In this example, the substrate is crystalline silicon, but can be other types of semiconductor materials. Also, in this example, the epitaxial layer 706 is P-type and the drift layer 704 is N-type, but these polarities may be reversed along with reversing the polarities of other doped regions described hereinbelow. Step 604 is forming channel region N-well 712 under a gate region (i.e. the channel region) and drain N-well 708 as shown in FIG. 7B. Ion implantation of phosphorus atoms at a density of $1 \times 10^{15}$ to $3 \times 10^{16}$ using mask 710 forms the N-wells. N-well 708 is the drain that corresponds to drain 216 (FIG. 2).

Figure 7C:
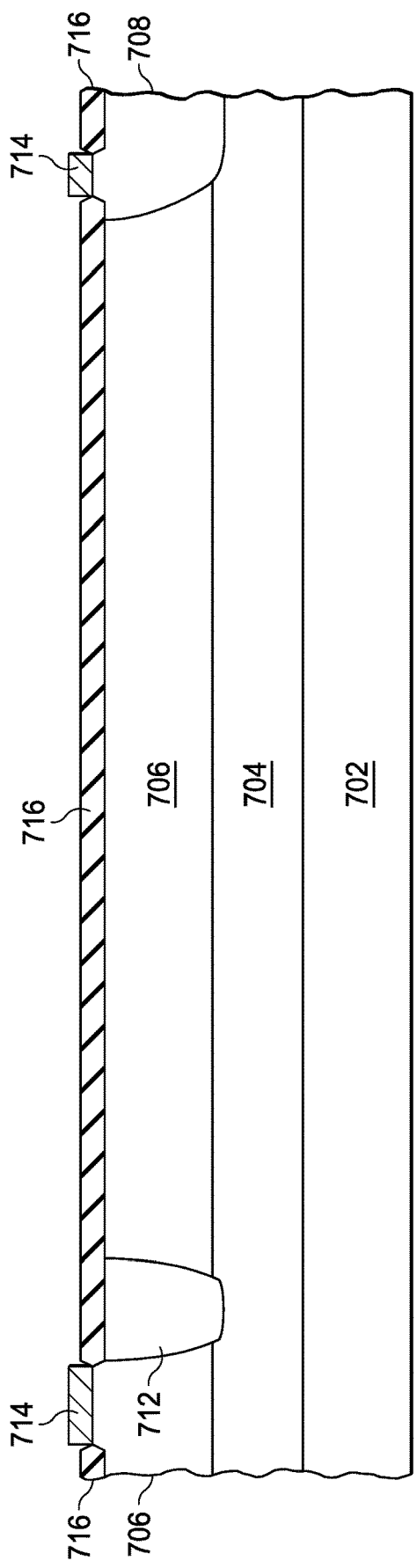

Step 606 is forming an insulating layer 716 that serves as an insulator above the drift region (the portion of epitaxial layer 706 between channel region N-well 712 and drain N-well 708) and as a gate insulator of LDMOS transistor 201 (FIG. 2) as shown in FIG. 7C. In this example, local oxidation of silicon (LOCOS) or shallow trench isolation (STI) forms insulating layer 716. With LOCOS, an oxidizing environment such as steam oxidizes the exposed portions of epitaxial layer 706 not covered by mask 714 to form a silicon dioxide layer to a thickness of 200 to 600 nm, such as insulating layer 716. With STI, an anisotropic etch such as plasma etching using carbon tetrafluoride etches the exposed portions of epitaxial layer 706 not covered by mask 714 to form a shallow trench. Deposition of silicon dioxide or another suitable insulator then fills the shallow trench to a thickness of 200 to 600 nm to form insulating layer 716.

Figure 7D:
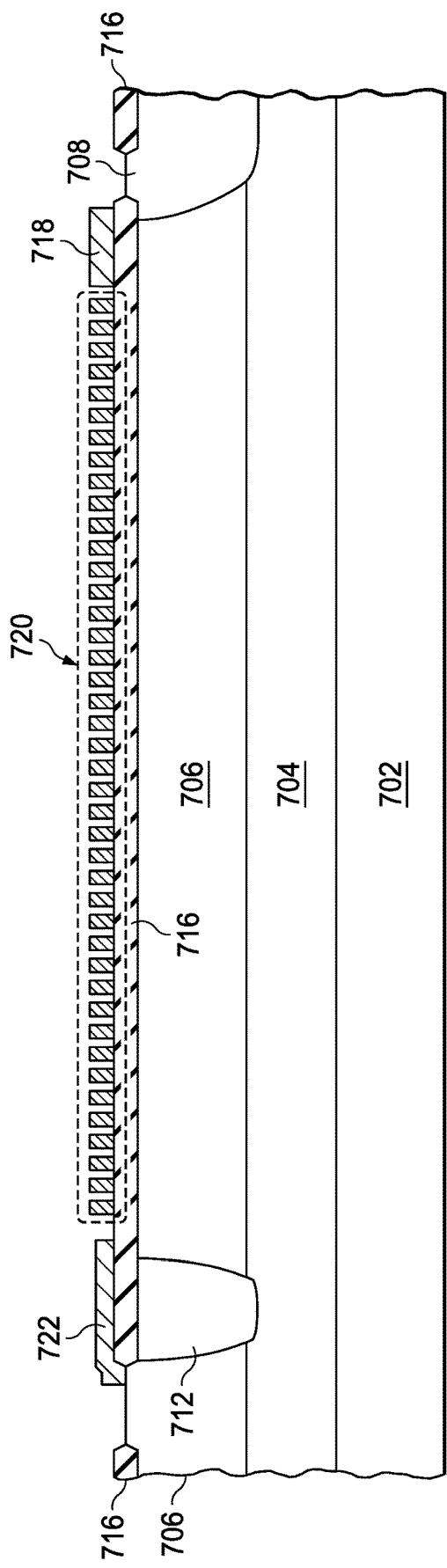
Figure 7G:
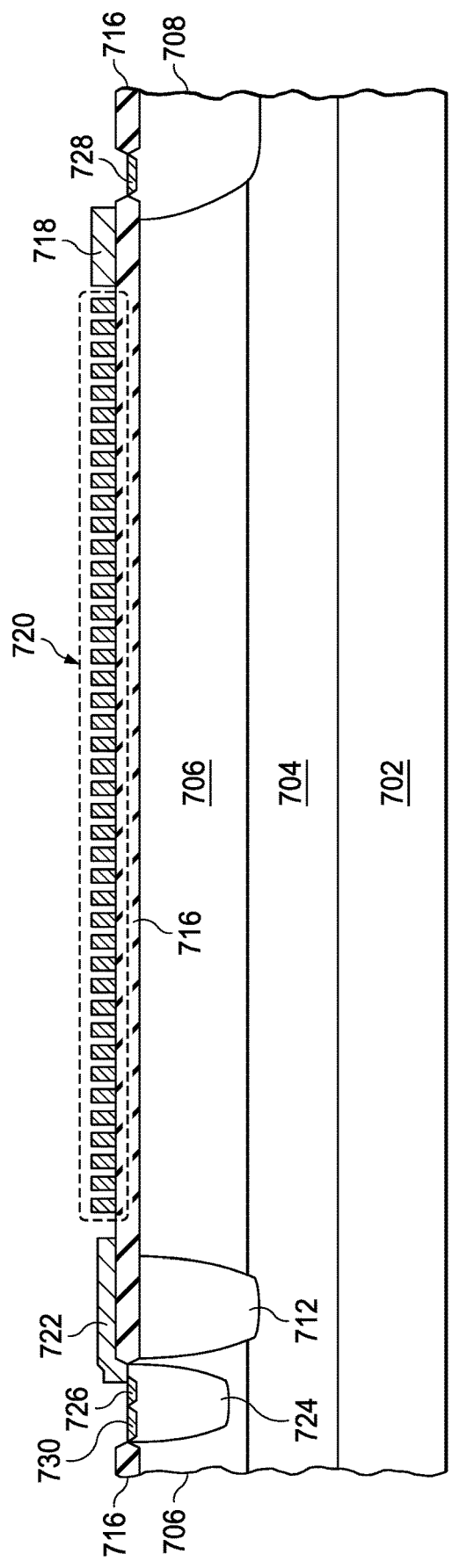

Step 608 is forming a patterned resistive layer 720 along with gate 722 and high voltage resistor contact 718 as shown in FIG. 7D. Depositing polycrystalline silicon and etching the deposited polycrystalline silicon using a photolithographic mask forms patterned resistive layer 720. In this example, polycrystalline silicon forms resistive layer 720. In other examples, silicon chromium (SiCr), nickel chromium (NiCr), and tantalum nitride (TaN) may form resistive layer 720. Resistive layer 720 corresponds to high voltage resistor 202 and low voltage resistor 203 (FIG. 2). Gate 722 corresponds to gate 210 (FIG. 2). In other examples, resistive layer 720, gate 722 and high voltage resistor contact 718 have other configurations that include regular or irregular loops, or open configurations like serpentine configurations. Step 610 is forming d-well 724 as shown in FIG. 7E. D-well 724 includes both n-type and p-type dopant atoms. For example, implantation of dopant atoms such as boron or indium provides the p-type part of d-well 724. An example is implanting of boron with an energy of 20 keV at a dose of $8\times10^{13}$ to $3.0\times10^{14}$ atoms/cm². Other examples use indium (In) because it is a relatively heavy atom that has the advantage of a low diffusion coefficient relative to boron. Implantation of an n-type dopant such as arsenic provides the n-type part of d-well 724. An example is implanting arsenic with a density of $5\times10^{13}$ to $1.2\times10^{15}$ atoms/cm² at an energy 10 to 30 keV. The selection of the angles and energies of implantation for d-well 724 determines, in part, the threshold voltage of the LDMOS transistor controlled by gate 722.

Step 612 is forming n+ source contact 726 and drain contact 728 as shown in FIG. 7F. A photolithographic mask (not shown) aligns n+ source contact 726 with gate 722. Insulating layer 716 also serving as a mask element. An example is implanting arsenic with a density of $5\times10^{15}$ atoms/cm² at an energy of 10 to 30 KeV to form n+ source contact 726 and drain contact 728. Step 614 is forming a p+ contact 730 to d-well 724. A photolithographic mask (not shown) aligns p+ contact 730. Insulating layer 716 also serves as mask. An example is implanting boron with a density of $5\times10^{15}$ atoms/cm² at an energy of 20 KeV to form p+ contact 730.

Figure 7H:
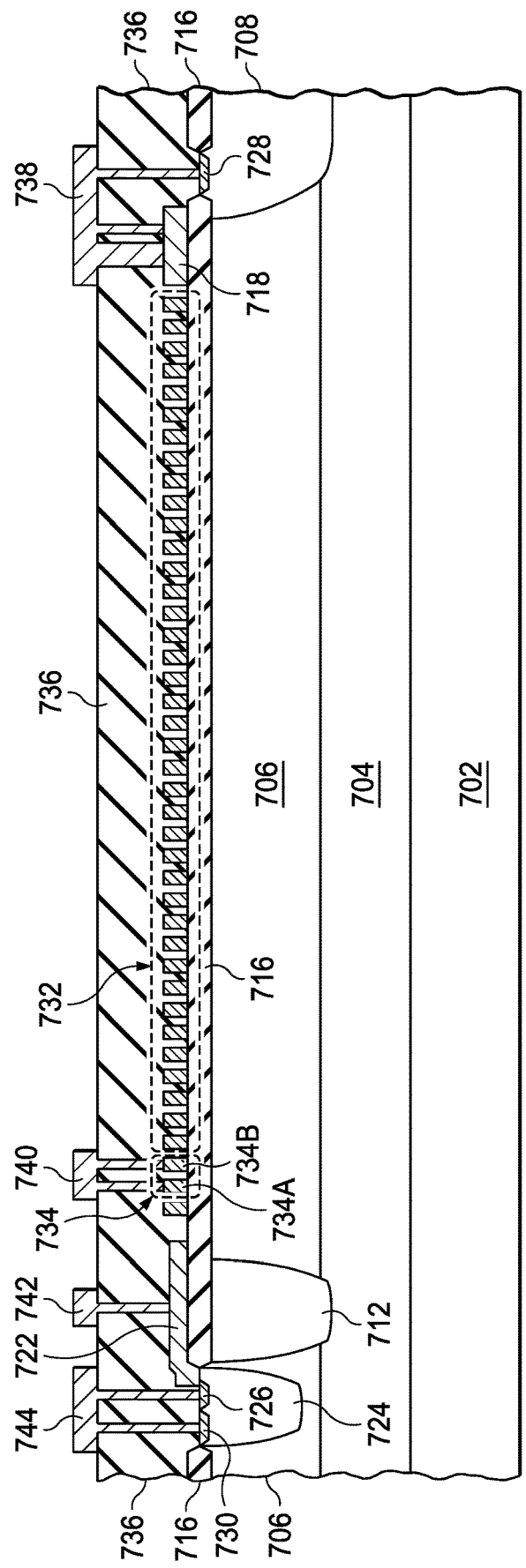

Step 616 is forming first level metal insulator 736 as shown in FIG. 7H. For example, vapor deposition of silicon dioxide using tetraethyl orthosilicate (TEOS) forms first level metal insulator 736 to a thickness of 1 to 2 followed by chemical-mechanical polishing (CMP). Step 618 is forming contact 738 to high voltage resistor contact 718, which is coupled to the spiral resistive element strip that is included in high voltage resistor 732 and drain contact 728; forming contact 740 to resistor 734, which includes low voltage resistive elements 734A and 734B coupled in parallel; forming contact 742 to gate 722; and forming contact 744 to source contact 726 and d-well contact 730. Using a mask (not shown), etching of first level metal oxide provides via openings for the respective contacts. A conductor such as aluminum fills the via openings. A planarization, such as CMP, removes any aluminum from the surface of first level metal insulator 736 leaving a top surface of the aluminum vias nearly flush with the surface of first level metal insulator 736. A first level metal, such as aluminum is deposited and patterned to complete contacts 738, 740, 742 and 744.

Modifications are possible in the described examples, and other examples are possible, within the scope of the claims.

What is claimed is:

1. A method comprising:
   forming an insulating layer over a semiconductor substrate;
   depositing a resistive layer on the insulating layer;
   patterning the resistive layer into a first resistive element, a second resistive element and a third resistive element; and
   after patterning the resistive layer, forming a direct contact between a first end of the first resistive element, a first end of the second resistive element, a second end of the third resistive element, and an output terminal.

2. The method of claim 1 in which the third resistive element is a spiral.

3. The method of claim 2 in which the first resistive element and the second resistive element are outside the spiral and the first resistive element and the second resistive element are adjacent.

4. The method of claim 1 in which the first resistive element and the second resistive element are parallel.

5. The method of claim 1 in which the third resistive element is an irregular spiral.

6. The method of claim 1 in which the third resistive element is in an open serpentine configuration.

7. The method of claim 1 in which the resistive layer is polycrystalline silicon.

8. The method of claim 1 in which the resistive layer is silicon chromium (SiCr).

9. The method of claim 1 in which the resistive layer is nickel chromium (NiCr).

10. The method of claim 1 in which the resistive layer is tantalum nitride (TaN).

* * * * *